United States Patent
Bourgoin et al.

(10) Patent No.: US 10,665,527 B2
(45) Date of Patent: May 26, 2020

(54) DEVICE FOR REMOVING HEAT

(71) Applicant: SAGEMCOM BROADBAND SAS, Rueil Malmaison (FR)

(72) Inventors: Gilles Bourgoin, Rueil Malmaison (FR); Alain Tisne, Rueil Malmaison (FR)

(73) Assignee: SAGEMCOM BROADBAND SAS, Rueil Malmaison (FR)

(*) Notice: Subject to any disclaimer, the term of this patent is extended or adjusted under 35 U.S.C. 154(b) by 0 days.

(21) Appl. No.: 16/465,512

(22) PCT Filed: Nov. 16, 2017

(86) PCT No.: PCT/EP2017/079460
§ 371 (c)(1),
(2) Date: May 30, 2019

(87) PCT Pub. No.: WO2018/099729
PCT Pub. Date: Jun. 7, 2018

(65) Prior Publication Data
US 2019/0341333 A1    Nov. 7, 2019

(30) Foreign Application Priority Data

Nov. 30, 2016  (FR) .................................... 16 61677

(51) Int. Cl.
*H01L 23/433*  (2006.01)
*F28F 3/04*    (2006.01)
(Continued)

(52) U.S. Cl.
CPC ............ *H01L 23/4338* (2013.01); *F28F 3/04* (2013.01); *H01L 23/3672* (2013.01);
(Continued)

(58) Field of Classification Search
CPC ............ H01L 23/4338; H01L 23/3672; H01L 23/552; H01L 23/66; H01L 23/49855; F28F 3/04
See application file for complete search history.

(56) References Cited

U.S. PATENT DOCUMENTS 5,321,582 A * 6/1994 Casperson .......... H05K 7/2049
                                            257/709
5,804,875 A * 9/1998 Remsburg .......... H01L 23/4093
                                             174/16.3
(Continued)

FOREIGN PATENT DOCUMENTS

EP      3098844 A1   11/2016
JP   2005019792 A    1/2005
(Continued)

OTHER PUBLICATIONS

JP 2005-19792 (machine translated document) (Year: 2005).*
(Continued)

*Primary Examiner* — Ahmed N Sefer
(74) *Attorney, Agent, or Firm* — Muncy, Geissler, Olds & Lowe, PC

(57) ABSTRACT

Removing device including: a heat exchanger that is mounted on a platen so that the exchanger lies above and a distance away from an electronic component; a chassis that lies between the electronic component and the platen, and device for fastening the chassis to the platen or to the electronic board; a rigid heat sink that is mounted on the chassis in order to slide perpendicularly to the electronic board and that has a first end making contact with the component and a second end in abutment against a thermally conductive layer that is fastened to the platen in order to elastically return the rigid heat sink into abutment against the electronic component whatever the thickness of the (Continued)

electronic component. Electronic equipment having such a removing device.

8 Claims, 4 Drawing Sheets

(51) Int. Cl.
  *H01L 23/367* (2006.01)
  *H01L 23/498* (2006.01)
  *H01L 23/552* (2006.01)
  *H01L 23/66* (2006.01)
(52) U.S. Cl.
  CPC ...... *H01L 23/49855* (2013.01); *H01L 23/552* (2013.01); *H01L 23/66* (2013.01); *H01L 2223/6644* (2013.01)

(56) References Cited

U.S. PATENT DOCUMENTS

| | | | |
|---|---|---|---|
| 5,805,417 A | 9/1998 | Nakagawa | |
| 6,705,388 B1 * | 3/2004 | Sorgo | H01L 23/3731 165/185 |
| 2007/0026567 A1 * | 2/2007 | Beer | G01S 7/032 438/106 |
| 2009/0200007 A1 * | 8/2009 | Foy | F28F 27/02 165/287 |
| 2013/0201631 A1 * | 8/2013 | Parker | H05K 1/186 361/728 |
| 2017/0250659 A1 * | 8/2017 | Lin | H03F 1/30 |

FOREIGN PATENT DOCUMENTS

| | | |
|---|---|---|
| JP | 2005109005 A | 4/2005 |
| JP | 2006210940 A | 8/2006 |
| JP | 2010258179 A | 11/2010 |
| JP | 2016096249 A | 5/2016 |
| WO | WO02099880 A1 | 12/2002 |
| WO | WO2015/111242 A1 | 7/2015 |

OTHER PUBLICATIONS

International Search Report and Written Opinion dated Feb. 26, 2018, in International Application No. PCT/EP2017/079460.
French Search Report dated Aug. 22, 2017 corresponding to FR 1661677.

* cited by examiner

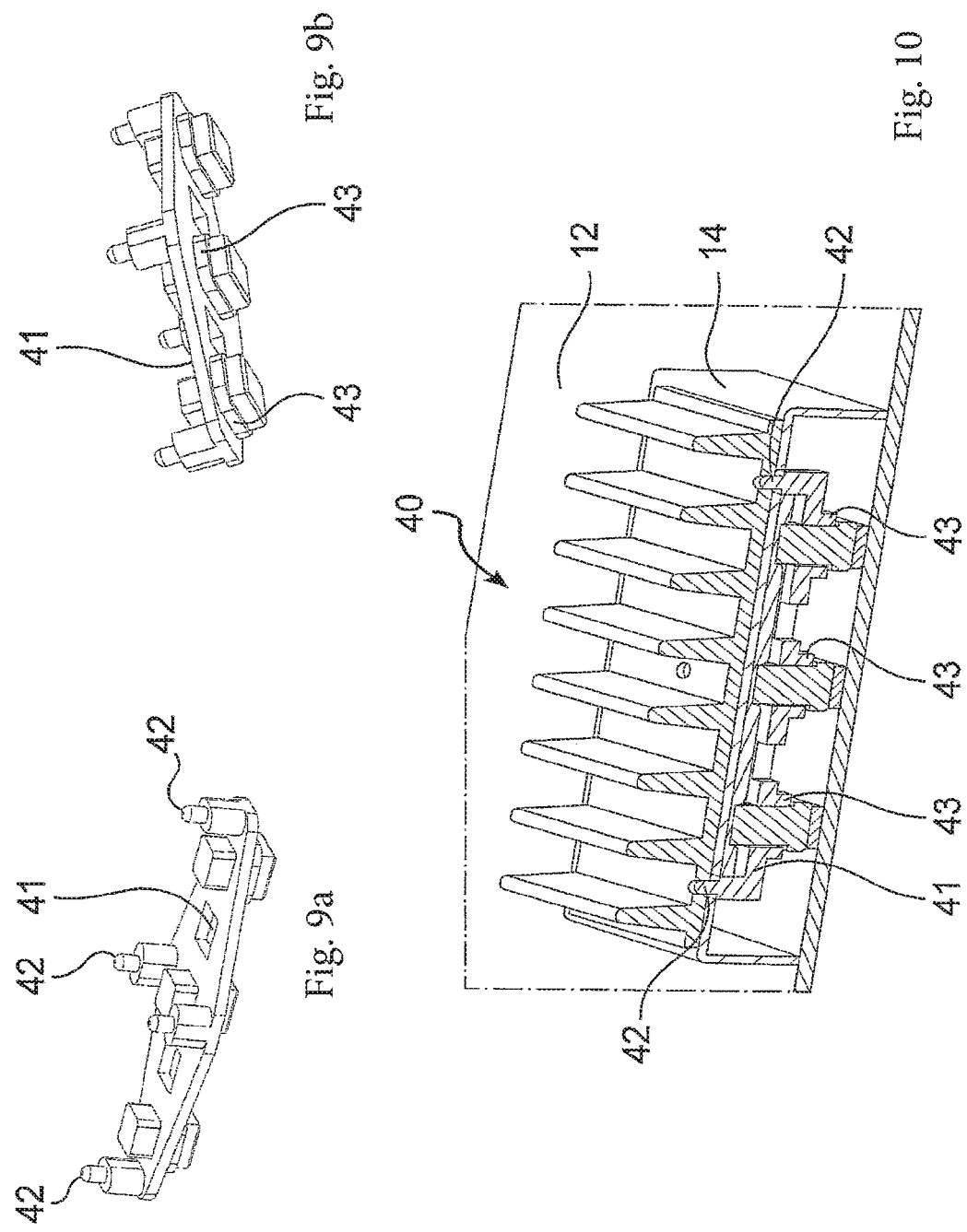

DEVICE FOR REMOVING HEAT

The invention relates to the field of devices for removing heat generated by electronic components.

BACKGROUND OF THE INVENTION

The efficiency of heat dissipation is of crucial importance in the design of numerous pieces of electronic equipment, in particular when the electronic equipment includes electronic components presenting high energy density, and the electronic equipment needs to satisfy requirements for reducing weight and size.

The power dissipated per unit area inside such a piece of electronic equipment can be very large and can lead to a rise in temperature that can in turn lead to failure of the electronic components of the electronic equipment.

With reference to FIG. 1, this problem is particularly difficult to handle when electronic components presenting high energy density are involved, such as radiofrequency power amplifiers 1, which components are positioned inside a shielding cover 2 in order to isolate the radiofrequency power amplifiers 1 electromagnetically.

In order to remove the heat produced by the amplifiers 1, it is known to position a thermal pad on the amplifiers 1. Nevertheless, such a thermal pad is not electromagnetically transparent because its relative permittivity εr is greater than 1. Furthermore, the relatively large size of the thermal pad, which covers an area considerably larger than the area of the amplifiers 1 in order to compensate for drifts in the positioning of the thermal pad, runs the risk of leading to coupling between an input and an output of the circuit constituted by the amplifiers 1, thereby reducing the efficiency of said circuit.

It is also known to cool the amplifiers 1 by making use solely of the heat-dissipating capability of the electronic card 3 on which the amplifiers 1 are mounted. Heat is then removed by the base of each amplifier 1 to the electronic card 3. Nevertheless, the heat removed from any one amplifier 1 then contributes to heating the other amplifiers 1.

With reference to FIG. 2, it is also known to mount a dissipater with fins 5 on the top wall of the shielding cover 2.

Finally, it is known to make use of a fan in order to cool the shielding cover 2 and the amplifiers 1 present inside the shielding cover 2.

OBJECT OF THE INVENTION

An object of the invention is to improve the removal of heat produced by an electronic component.

SUMMARY OF THE INVENTION

In order to achieve this object, there is provided a heat sink device for removing heat produced by at least one electronic component mounted on an electronic card, the heat sink device comprising:
- a heat dissipater mounted on a plate provided with means for fastening it on the electronic card so that the dissipater extends over and at a distance from the electronic component;
- a bridge extending between the electronic component and the plate, and fastener means for fastening the bridge to the plate or to the electronic card;
- a rigid thermal drain that is mounted on the bridge to slide perpendicularly to the electronic card and that has a first end in contact with the component and a second end pressing against an elastically deformable and thermally conductive layer fastened to the plate in order to urge the thermal drain elastically to bear against the component regardless of the thickness of the electronic component.

The drain makes it possible to remove the heat that is produced by the electronic component to the heat dissipater in efficient manner by performing localized heat extraction. The removal of heat is efficient regardless of the thickness of the electronic component and, in particular, it is thus robust in the face of variations of thicknesses due to the manufacturing tolerances of the electronic component. The removal of heat is efficient regardless of the distance between the electronic component and the heat dissipater.

A solution is thus obtained that is simple, inexpensive, and very efficient for dissipating the heat produced by the electronic component. It should be observed that in the situation shown in FIGS. 1 and 2, and when the heat sink device is for removing heat produced by a plurality of electronic components, the heat sink device does not generate any electromagnetic coupling or electromagnetic disturbance between the electronic components.

The invention also provides electronic equipment comprising an electronic card, an electronic component, and a heat sink device as described above.

The invention can be better understood in the light of the following description of particular, non-limiting embodiments of the invention.

BRIEF DESCRIPTION OF THE DRAWINGS

Reference is made to the accompanying drawings, in which:

FIGS. 9a and 9b are figures analogous to FIGS. 3a and 3b for a heat sink device in a second embodiment of the invention;

FIG. 10 is a figure analogous to FIG. 6 for the heat sink device in the second embodiment of the invention.

DETAILED DESCRIPTION OF THE INVENTION

Figure 1:
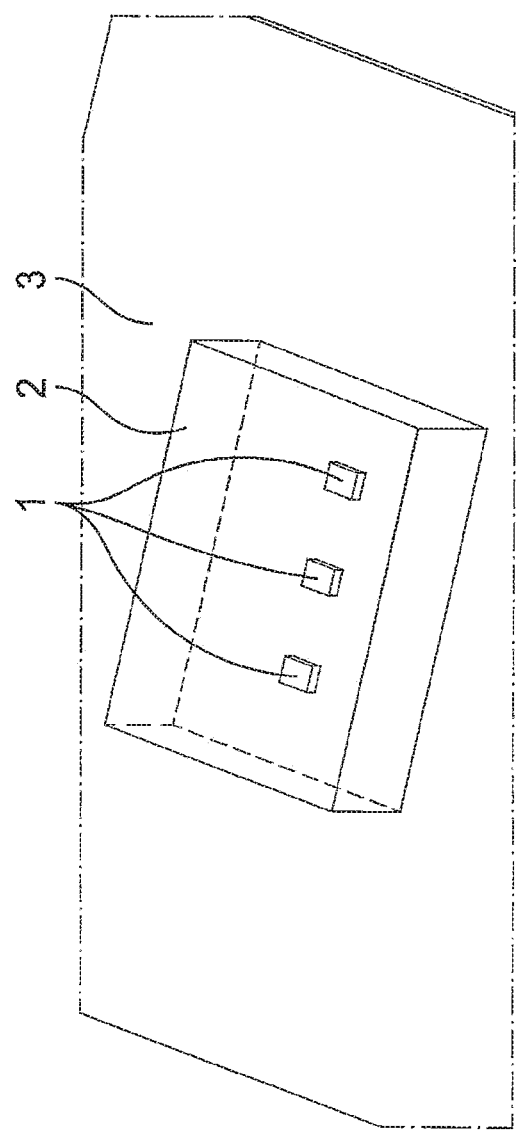
FIG. 1 shows an electronic card, electronic components, and a shielding cover.
Figure 2:
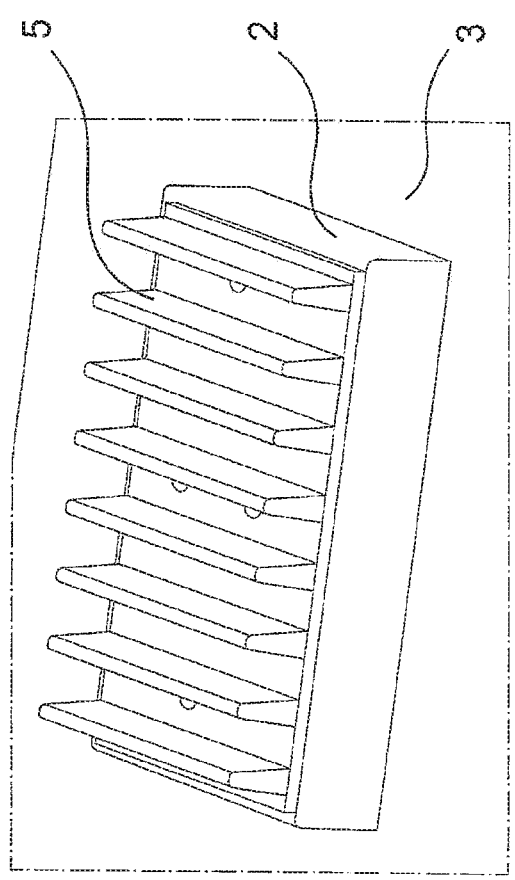
FIG. 2 shows an electronic card, a shielding cover, and a heat dissipater mounted on the shielding cover.
Figure 3A:
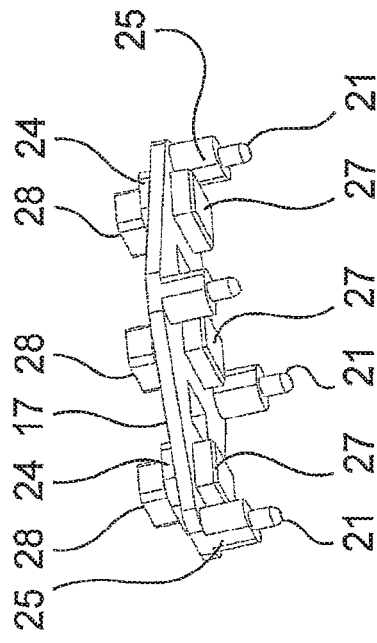
FIGS. 3a and 3b comprise perspective views from above and below of a bridge and heat drains of a heat sink device in a first embodiment of the invention.
Figure 3B:
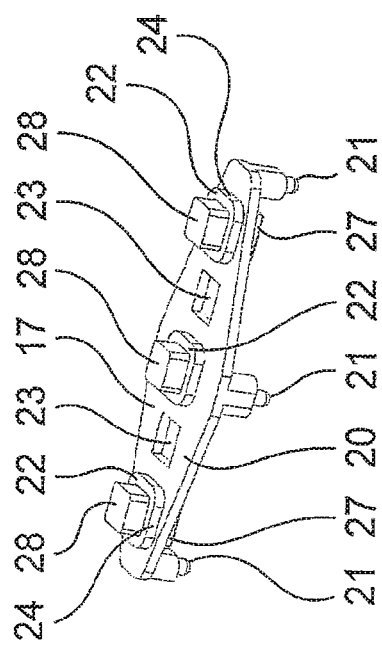
Figure 4:
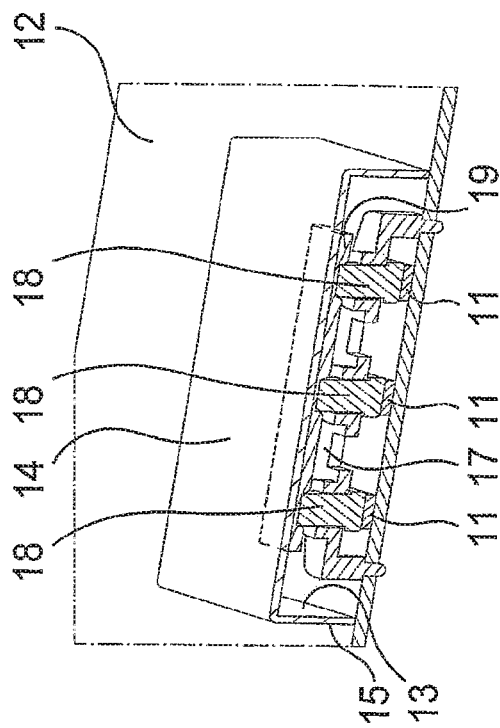
FIG. 4 is a view in section and in perspective showing the bridge and the drains, the bridge being mounted on an electronic card.
Figure 5:
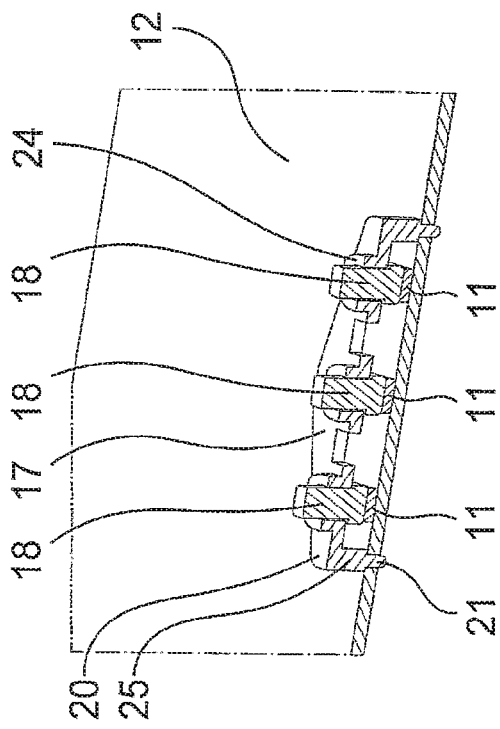
FIG. 5 is a view analogous to FIG. 4 also showing a shielding cover and a layer that is elastically deformable and thermally conductive.
Figure 6:
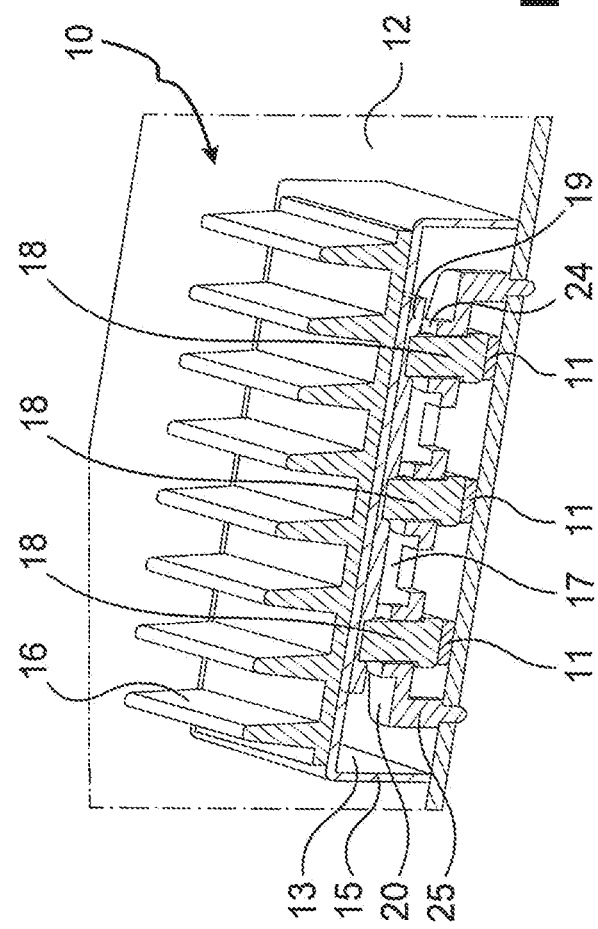
FIG. 6 is a view analogous to FIG. 5 also showing a thermal dissipater on the shielding cover.

With reference to FIGS. 3 to 6, the heat sink device 10 in a first embodiment of the invention is intended in this example for removing the heat produced by three radiofrequency power amplifiers 11 mounted in alignment on an electronic card 12 of a piece of electronic equipment, and covered by a shielding cover 13. The shielding cover 13 isolates the three amplifiers 11 electromagnetically, i.e. it serves firstly to prevent the operation of the three amplifiers 11 being degraded by external electromagnetic disturbances, and secondly to prevent the operation of the three amplifiers 11 producing electromagnetic disturbances that might degrade the operation of other electronic components.

The shielding cover 13 has a top wall forming a plate 14 and side walls 15. The shielding cover 13 (and thus the plate 14) is fastened to the electronic card 12 by conventional fastener means that are not described herein.

The heat sink device 10 has a heat dissipater 16, a bridge 17, three rigid heat drains 18, and an elastically deformable and thermally conductive layer 19.

In this example, the heat dissipater 16 is a heat dissipater with fins, and it is mounted on the plate 14 (more precisely on a top face of the plate 14). The heat dissipater 16 thus extends above the amplifiers 11 and at a distance therefrom.

The bridge 17 extends between the amplifiers 11 and the plate 14.

The bridge 17 comprises a platform 20, legs 25 that raise the platform 20, and fastener means 21 for fastening the bridge 17 to the electronic card 12. The fastener means 21 may be means for fastening by staking/heading, snap-fastening, adhesive, or any other type of fastening.

In this example, the platform 20 extends parallel to the electronic card 12 and to the plate 14. Five cavities in alignment are made in the platform 20, comprising three sliding cavities 22 and two simple cavities 23. Each simple cavity 23 lies between two sliding cavities 22.

Each cavity 22, 23 opens out in a top opening in a top face of the platform 20 and in a bottom opening in a bottom face of the platform 20. The top opening of each slide cavity 22 is surrounded by an extra thickness of the platform 20 forming a collar 24.

Each drain 18 is in the form of a piston and has a first end and a second end. The first end is a head 27 of the piston, and the second end is an end 28 of a piston rod.

Each drain 18 is mounted on the platform 20 of the bridge 17 to slide perpendicularly to the electronic card 12 through a slide cavity 22 and the associated collar 24. The head 27 of the piston of the drain 18 extends beside a bottom face of the platform 20. The slide cavities 22 and the drains 18 are positioned in such a manner that when the heat sink device 10 is mounted on the electronic card 12 over the amplifiers 11, the head 27 of each drain 18 is positioned facing one of the amplifiers 11.

The elastically deformable layer 19 is fastened to the plate 14 (more precisely to a bottom face of the plate 14), and it extends over the platform 20 of the bridge 17 and the three drains 18.

When the heat sink device 10 is mounted on the electronic card 12 over the amplifiers 11, each drain 18 can move so as to slide in such a manner that the head 27 of the drain 18 comes into contact with the amplifier 11 that it is positioned to face. The elastically deformable layer 19 urges the drain 18 to bear resiliently against the amplifier 11, regardless of the thickness of the amplifier 11.

Thus, regardless of the thickness of the amplifier 11, and thus in particular regardless of any variations in thickness of the amplifier 11 due to manufacturing tolerances for the amplifier 11, the drain 18 is in contact both with the amplifier 11 and also with the elastically deformable layer 19, said elastically deformable layer 19 itself being in contact with the plate 14 on which the heat dissipater 16 is mounted. The heat produced by the amplifier 11 can thus be removed by conduction as far as the heat dissipater 16 and then dissipated by said heat dissipater 16.

Figure 8:
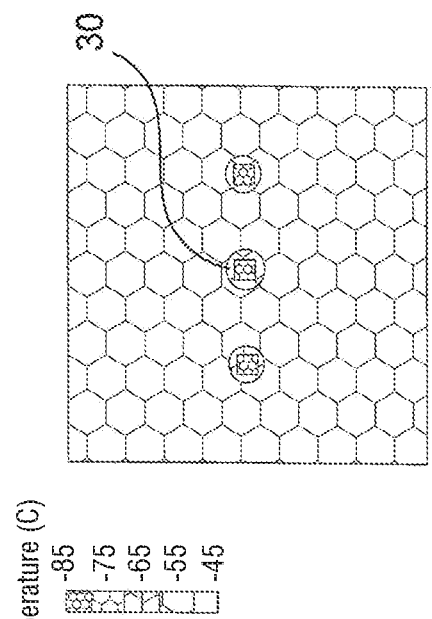
FIG. 8 shows temperature distribution on the electronic card in the situation shown in FIG. 6.
Figure 7:
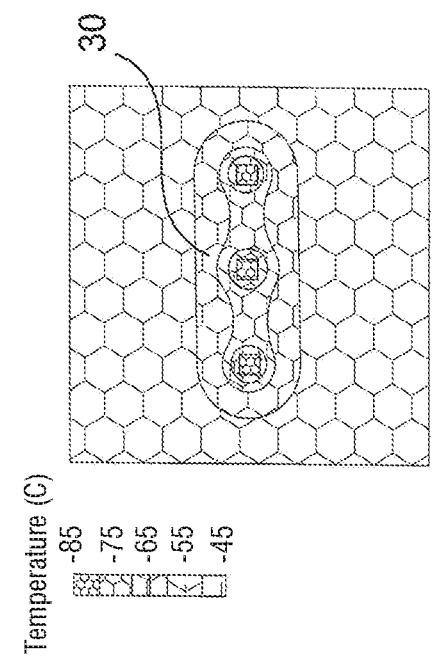
FIG. 7 shows temperature distribution on the electronic card in the situation shown in FIG. 2.

The effectiveness of the heat sink device 10 in the first embodiment of the invention is illustrated by FIGS. 7 and 8.

The temperature distribution shown in FIG. 7, which was obtained by simulation, corresponds to the electronic card 12 on which the three amplifiers 11 are mounted, being covered by the shielding cover 13 and without the heat sink device 10 being used. Each amplifier 11 presents a square box-shape having a side of 3 millimeters (mm) and a thickness of 0.5 mm. The electronic card 12 is also of square box-shape having a side of 60 mm. The shielding cover 13 presents a rectangular box-shape having a length of 60 mm, a width of 20 mm, and a thickness of 5 mm. The heat dissipater 16 has ten fins, each having a height of 5 mm and a thickness of 3 mm at its base.

It should be observed that the mean temperature of each amplifier 11 is about 120° C. It should also be observed that the zone 30 situated around the amplifiers 11 presents a temperature of about 65° C.

The temperature distribution of FIG. 8 corresponds to a situation similar to that of FIG. 7, in which the heat sink device of the first embodiment 10 is used.

Each drain 18 in this example is made of thermal polyamide presenting vertical conductivity equal to 8 watts per meter per kelvin (W/m.K) and horizontal conductivity equal to 1 W/m.K. The elastically deformable layer 19 presents a thickness of 0.5 mm and conductivity of 2 W/m.K.

It should be observed that the mean temperature of each amplifier 11 is about 80° C., i.e. a drop of 40° C. It should also be observed that the zone 30 presents a temperature of about 55° C., i.e. a drop of about 10° C.

With reference to FIGS. 9 and 10, the heat sink device 40 in a second embodiment of the invention is similar to the heat sink device 10 in the first embodiment of the invention, except that in this embodiment the bridge 41 is fastened to the plate 14 (and more precisely to a bottom face of the plate 14) and not to the electronic card 12. The fastener means 42 of the bridge 41 are thus means for fastening the bridge 41 to the plate 14. It should also be observed that in this embodiment it is the bottom openings of the slide cavities that are surrounded by respective extra thicknesses of the platform to form collars 43.

Naturally, the invention is not limited to the embodiment described, but covers any variant coming within the ambit of the invention as defined by the claims.

Although it is stated that the heat sink devices described herein remove the heat produced by radiofrequency power amplifiers, the invention naturally applies to any type of electronic component.

Although heat sink devices described are suitable for removing the heat produced by three electronic components, a heat sink device of the invention can perfectly well be designed to remove the heat produced by some other number of electronic components (at least one component).

The plate, which is in this example is a top wall of a shielding cover, could perfectly well be a simple plate serving only to carry the heat dissipater.

Throughout the document, the term "electronic component" refers to any type of component suitable for mounting on an electronic card. By way of example, such a component may be a semiconductor-based electronic component such as an amplifier, a processor, a diode, a transistor, etc. Such a component could equally well be an active component or a passive or electrical component such as a resistor, a coil, a capacitor, a filter, etc.

The invention claimed is:

1. A heat sink device for removing heat produced by at least one electronic component mounted on an electronic card, the heat sink device comprising:
   a heat dissipater mounted on a plate so that the heat dissipater extends over and at a distance from the electronic component when the plate is fastened on the electronic card;
   a bridge extending between the electronic component and the plate, and fastener means for fastening the bridge to the plate or to the electronic card;
   a rigid thermal drain that is unfixedly and slidably mounted on the bridge while the bridge is at a position fixed by the fastener means, the rigid thermal drain being mounted on the bridge to slide perpendicularly to the electronic card and that has a first end in contact with the electronic component and a second end pressing against an elastically deformable and thermally conductive layer fastened to the plate in order to urge the rigid thermal drain elastically to bear against the electronic component regardless of the thickness of the electronic component, the elastically deformable and thermally conductive layer being positioned between the heat dissipater and the bridge.

2. The heat sink device according to claim 1, wherein the rigid thermal drain is in the form of a piston having a rod and a head, the first end of the rigid thermal drain being a head of the piston and the second end being an end of the rod.

3. The heat sink device according to claim 1, wherein the rigid thermal drain is made of polyamide.

4. The heat sink device according to claim 1, wherein the plate is a top wall of a shielding cover.

5. The heat sink device according to claim 1, wherein the heat dissipater is a finned heat dissipater.

6. An electronic equipment including an electronic card, an electronic component, and a heat sink device according to claim 1.

7. The electronic equipment according to claim 6, wherein the electronic component is a radiofrequency power amplifier.

8. The heat sink device according to claim 1, wherein the elastically deformable and thermally conductive layer contacts and directly sandwiched by the heat dissipater and the bridge.

* * * * *